United States Patent [19]

James et al.

[11] Patent Number: 5,701,439

[45] Date of Patent: Dec. 23, 1997

[54] COMBINED DISCRETE-EVENT AND CONTINUOUS MODEL SIMULATION AND ANALYSIS TOOL

[75] Inventors: David C. James, Downey; John R. Clymer, Placentia; Philip D. Corey, Placentia; Nafise Nili, Placentia, all of Calif.

[73] Assignee: Boeing North American, Inc., Seal Beach, Calif.

[21] Appl. No.: 860,654

[22] Filed: Mar. 30, 1992

[51] Int. Cl.$^6$ ................................................. G06F 9/455
[52] U.S. Cl. ................................................. 395/500
[58] Field of Search ................................... 395/500

[56] References Cited

U.S. PATENT DOCUMENTS 4,965,743  10/1990  Malin et al. ........................ 395/500
5,247,650  9/1993  Judd et al. ........................ 395/500

OTHER PUBLICATIONS

Fishwick et al., "Creating Qualitative and Combined Models with Discrete Events", IEEE, 1991, pp. 306–315.
Hatono et al., "Modeling and On–Line Scheduling of Flexible Manufacturing Systems Using Stochastic Petri Nets", *IEEE Transactions on Software Engineering*, vol. 17, No. 2, Feb. 1991, pp. 126–132.

*Primary Examiner*—William M. Treat
*Attorney, Agent, or Firm*—Harry B. Field; Lawrence N. Ginsberg

[57] ABSTRACT

The tool comprises the first step of providing a first software component, serving as a timing element, for receiving global synchronization commands as input and issuing global simulation scheduler task dispatch commands as output. A second software component is provided, serving as a global simulation scheduler, for receiving the global simulation scheduler task dispatch commands as input, synchronizing discrete event model and continuous model task dispatch as a function of simulation time, and issuing local simulation scheduler task dispatch commands as output. At least a single third software component is provided, serving as a local simulation scheduler, for receiving the local simulation scheduler task dispatch commands as input and issuing local simulation task execution commands as output. The combination of these steps provides a processing environment wherein the local simulation task execution commands invoke user supplied simulation application tasks in a time synchronized manner.

14 Claims, 7 Drawing Sheets

COMBINED DISCRETE-EVENT AND CONTINUOUS MODEL SIMULATION AND ANALYSIS TOOL

BACKGROUND OF THE INVENTION

1. Field of the Invention

This invention is a simulation tool for analyzing the behavior of discrete and continuous systems and as such relates to the fields of both discrete-event simulation and continuous model simulation.

2. Description of the Related Art

Modern simulation systems typically adhere to one of two generic philosophies: discrete-event, or continuous model. These two disciplines operate in significantly different form, at opposite ends of the simulation spectrum. Some simulation systems may have provision for a measure of support in the opposing discipline, but generally in a limited manner.

In the discrete-event simulation philosophy a physical system is represented by a simulation model having a discrete set of states. Each simulation state is associated with a particular condition of the physical system. A change in the physical state of the modelled system is represented by a transition to a corresponding simulation state. A sequence of these transitions, representing progression of time in the physical system, is accomplished by executing a sequence of functions, called events. These events are maintained on a time ordered list, the event list. Execution of an event causes simulation processing to occur that updates state variables of the system. In the course of processing an event, other events may be added to or deleted from the event list.

Continuous model simulation is a digital algorithmic implementation of a set of differential equations representing the state of a physical system as a function of time. A solution to the equation set is computed for a given time. Each solution represents the state of the modelled system at that point in the time continuum. A sequence of these solutions represents the time progression state change of the physical system.

Development of major current day Department of Defense and aerospace systems has numerous project phases. At each phase, simulation requirements vary. The need for an advanced real-time simulation testbed is manifest in a context that may be unique, or only partially compatible, with the simulation requirements of another project phase. Typically, as a project progresses from requirements and feasibility studies to detail design, test, manufacturing, and operation phases, simulation requirements gradually progress from the discrete-event end of the simulation spectrum to the continuous model end, with varying mixtures of the two in between.

If a large scale real-time simulation system is to prove useful throughout all phases of such a project environment, it will require an integrated simulation framework that permits the combination of continuous and discrete-event models and multicomputers and multiprocessors. Such a real-time testbed should also provide a mixed-languages capability that includes Ada, FORTRAN and C modules executed concurrently, and embedded processors and other hardware components.

As will be disclosed below, the present invention is a generic simulation executive that provides the means by which both discrete-event and continuous model simulations using mixed language software may be accomplished. The objective in developing this simulation tool is to provide a uniform simulation platform appropriate for all combinations of simulation model requirements, language implementations, and host processor types. The simulation tool permits discrete event processes to be integrated with continuous processes so that a model can evolve from a primarily discrete event simulation to a primarily continuous model simulation within a single environment. The simulation tool allows parallel processing of the application program's logical units.

Present co-inventor J. Clymer has developed a simulation design methodology based on a graphical representation of discrete event simulations that run on a single processor and a software system that runs on personal computers. (See "Systems Analysis Using Simulation and Markov Models", John R. Clymer—Hall International, Inc., 1990; see also the article entitled "Operation Evaluation Modeling", SIMULATION, Volume 54, No. 6 (December 1990), J. Clymer, P. Corey, N. Nili, pages 327–336; and the article entitled "Discrete Event Simulation of Object Movement and Interactions", SIMULATION, Volume 56, No. 3 (March 1991), pages 167–174.).

J. Clymer and D. Hernandez applied the methodology discussed in "Systems Analysis Using Simulation and Markov Models", discussed above, to investigate current algorithms used for distributed simulation. (See the article entitled "Opem Distributed Simulation", SIMULATION, by J. Clymer, D. Hernandez, The Society for Computer Simulation, Volume 57, No. 6, December 1991, pages 396–404.) In this article, the appropriateness of these existing algorithms for aerospace applications was examined. The article discusses alternatives to those existing algorithms.

SUMMARY OF THE INVENTION

The present invention provides a method for analysis of an application specific system using combined discrete event and continuous model simulation. In its broadest aspects it comprises the first step of providing a first software component, serving as a timing element, for receiving global synchronization commands as input and issuing global simulation scheduler task dispatch commands as output. A second software component is provided, serving as a global simulation scheduler, for receiving the global simulation scheduler task dispatch commands as input, synchronizing discrete event model and continuous model task dispatch as a function of simulation time, and issuing local simulation scheduler task dispatch commands as output. At least a single third software component is provided, serving as a local simulation scheduler, for receiving the local simulation scheduler task dispatch commands as input and issuing local simulation task execution commands as output. The combination of these steps provides a processing environment wherein the local simulation task execution commands invoke user supplied simulation application tasks in a time synchronized manner.

The present invention has several advantages relative to general simulation techniques. This simulation tool provides, on a single platform, simulation facilities presently accessible only on a variety of generally incompatible systems. The tool permits development of a simulation model in a uniprocessor non-real-time desktop workstation and then the migration of that model to a large multiprocessing real-time simulation system, without significant changes to the implementation of the model. The architecture of the tool permits the use of mixed language models, wherein each model functions as a separate process. The architecture permits the use of multiple, possibly nonhomogeneous, processors and operating systems. Most importantly, the architecture provides the means for combining the two seemingly disparate worlds of discrete-event and continuous model simulation in a single environment, in any proportion or combination required by the application under development.

Other objects, advantages and novel features of the present invention will become apparent from the following Detailed Description of the invention when considered in conjunction with the accompanying drawings.

BRIEF DESCRIPTION OF DRAWINGS

The elements or parts throughout the figures of the drawings are designated by the same reference characters.

DETAILED DESCRIPTION OF THE PREFERRED EMBODIMENT

The function of the simulation tool (executive) is to provide a controlling mechanism by which a mixture of application software subsystems, constructed as either discrete-event or continuous model simulation components, may be executed on a network of computer processors synchronized to simulation time, optionally synchronized to real time. Application software subsystems consist of a set of one or more processes; each process, or group of related processes, incorporates software that simulates some subsystem of the target application. In this context, a process is an independent program, or load module, that is assigned to a processor for execution. Each load module may be coded in the language most appropriate for that subsystem. Languages may thus be mixed at the process level in the the simulation system. A small library of simulation executive interface routines is required for each language implementation. The combined interaction of these subsystem components constitutes the target simulation environment.

The preferred embodiment of the simulation tool described herein employs the C programming language and the facilities provided by the Unix System V and pSOS operating system environments, as hosted on the BBN TC2000, Sun Sparc Workstations, and various VME based Motorola 88000 processor boards. Even though this is the preferred embodiment, there is nothing about the invention that precludes it from being implemented in various manifestations other than the one described here.

The simulation executive controls the execution dispatch of each process within each subsystem component. Simulation execution proceeds as a succession of cycles, or frames. The time duration between each discrete-event frame varies as a function of the events being executed and may vary widely during execution of the simulation. Continuous model frames are generally at fixed length intervals, but may vary from one subsystem to another. An important aspect of this simulation tool is that it aligns, whenever possible, continuous model cycle times to coincide with discrete event cycle times, so that information passed between subsystems within the simulation is coherent and timely.

Figure 1:
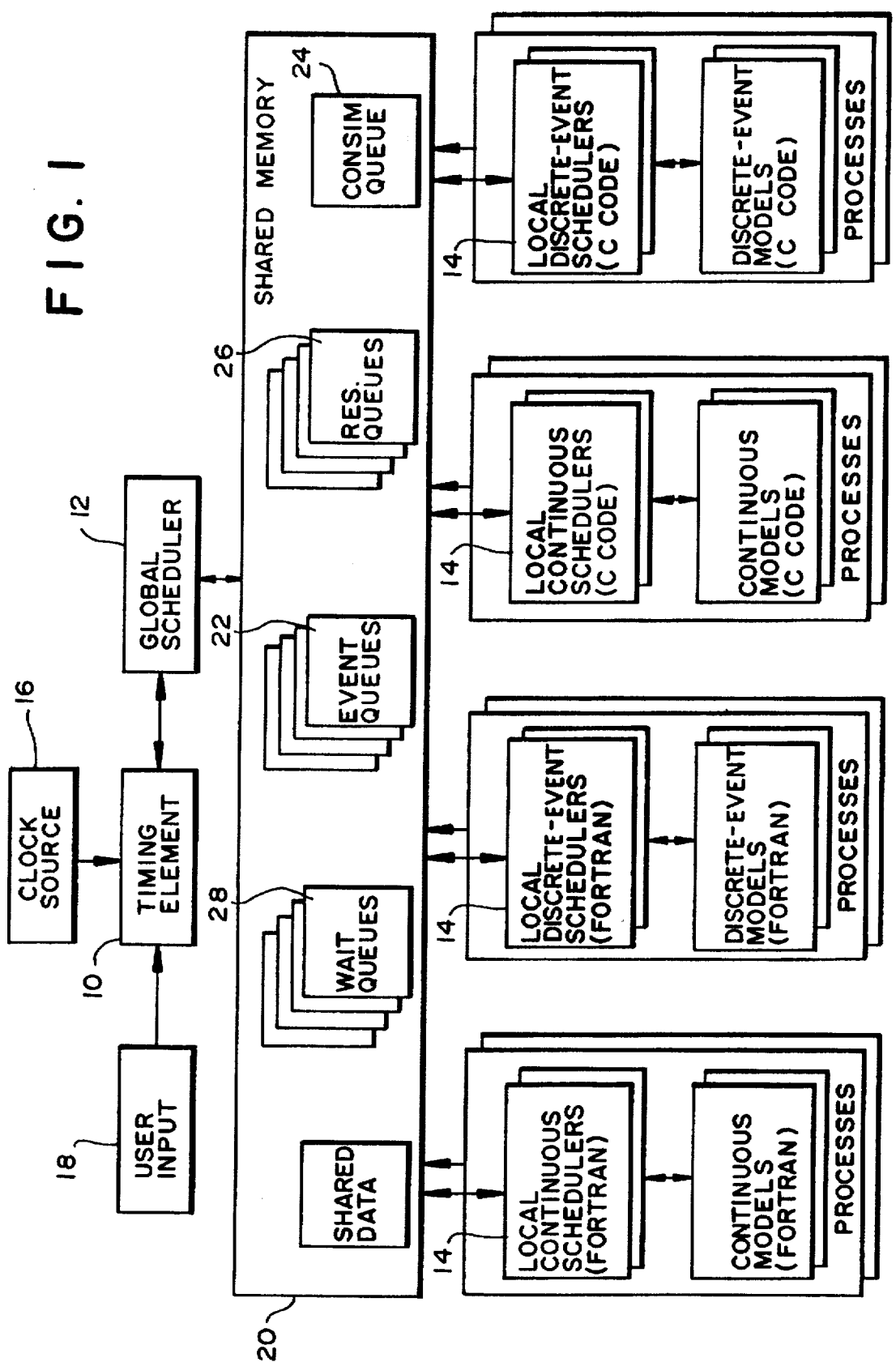
FIG. 1 is a system level block diagram which defines the modular layout of the major software components of the present invention and includes designations denoting data flow.

Major software components of the executive are shown in FIG. 1: the timing element 10, the global simulation scheduler 12, and the local simulation schedulers 14. The timing element 10 maintains system mode and time, and provides overall execution control of the simulation subsystem components. When operating in the real-time mode, it accepts clock source input 16 and user command input 18; in non-real-time mode, it accepts user command input 18 only. The timing element 10 processes its inputs to determine the current simulation system state and time, then issues a command to the global scheduler to commence simulation frame processing for the current cycle. The global scheduler 12 is the master scheduler for each simulation cycle. When commanded by the timing element 10 to execute a cycle, the global scheduler examines the state of all discrete-event and continuous model queues in the system, selects a suitable set of processes to execute, and issues commands to the local schedulers 14 associated with each selected process. Each local scheduler controls the execution of a single process within an application subsystem. Local schedulers manage the operation of both discrete-event and continuous model components, selecting and executing appropriate application software components depending on the current simulation state, cycle, and time.

Figure 6:
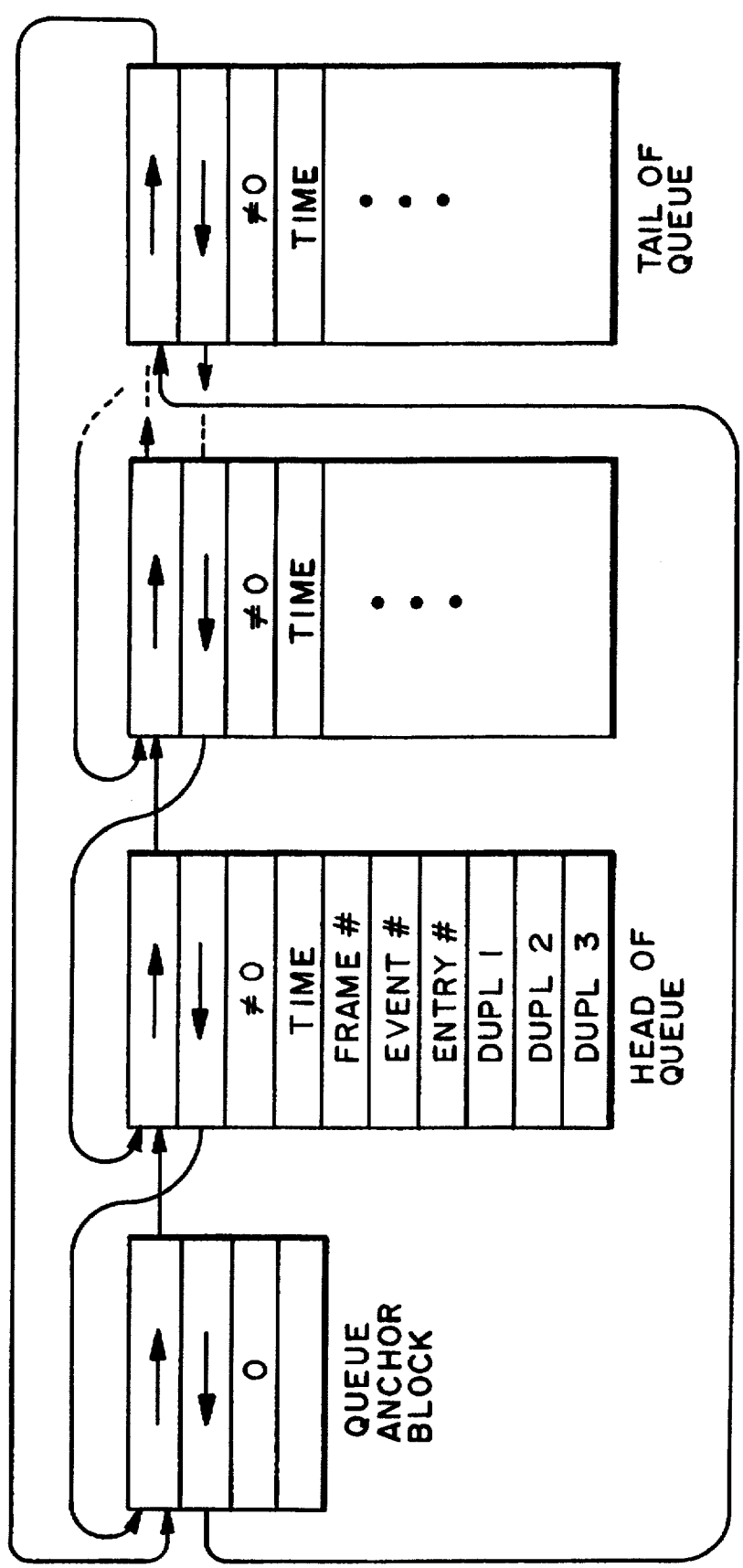
FIG. 6 is a diagram showing the linked list structure of the system queues.
Figure 7:
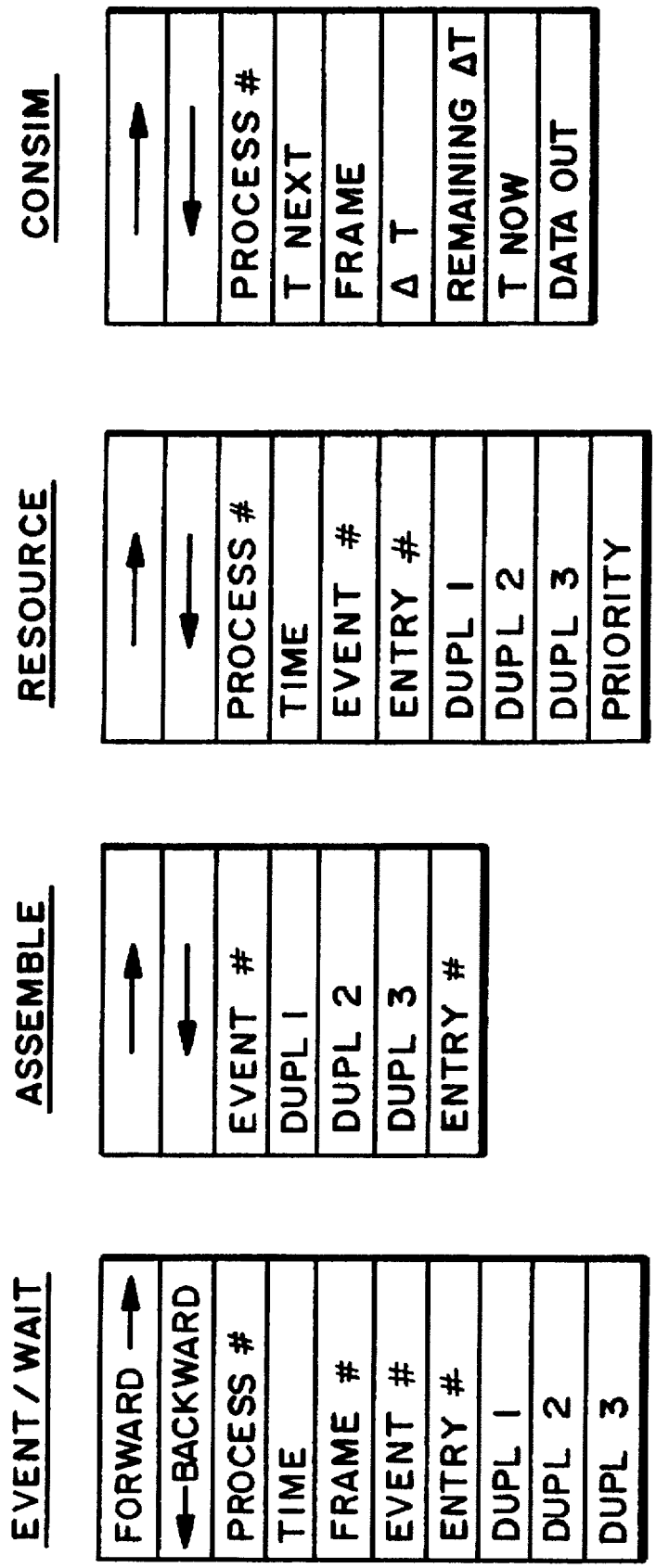
FIG. 7 illustrates the content of each of the different types of queue entries.

All global data and control structures, designated as 20 in FIG. 1, reside in shared memory accessible to any process that requires them. The discrete-event components of the system use a set of execution (event) 22, wait 28, and resource 26 queues for each discrete-event process; a single continuous model execution (consim) 24 queue is shared by all continuous model processes. All queues are maintained as doubly linked lists, a representative example of which is shown in FIG. 6. FIG. 7. shows examples of the content of various types of queue entry blocks. Any given queue will contain only queue entry blocks of a uniform type. Event queues are ordered by event time, with the earliest time at the head of the queue. Resource and wait queues are first-in first-out queues, and the consim queue is ordered by priority.

The dynamic time oriented execution of a target simulation, referred to as the operate mode, is one phase of any simulation. In general, a simulation system must be initialized to some desired state before the operate mode can begin. All application subsystem components must be prepared for execution by initializing the state of all pertinent problem variables in the application. Hardware in the simulation loop may require preparation prior to entering the operate mode. Once the simulation system has been satisfactorily initialized, the operate mode may begin.

Figure 2:
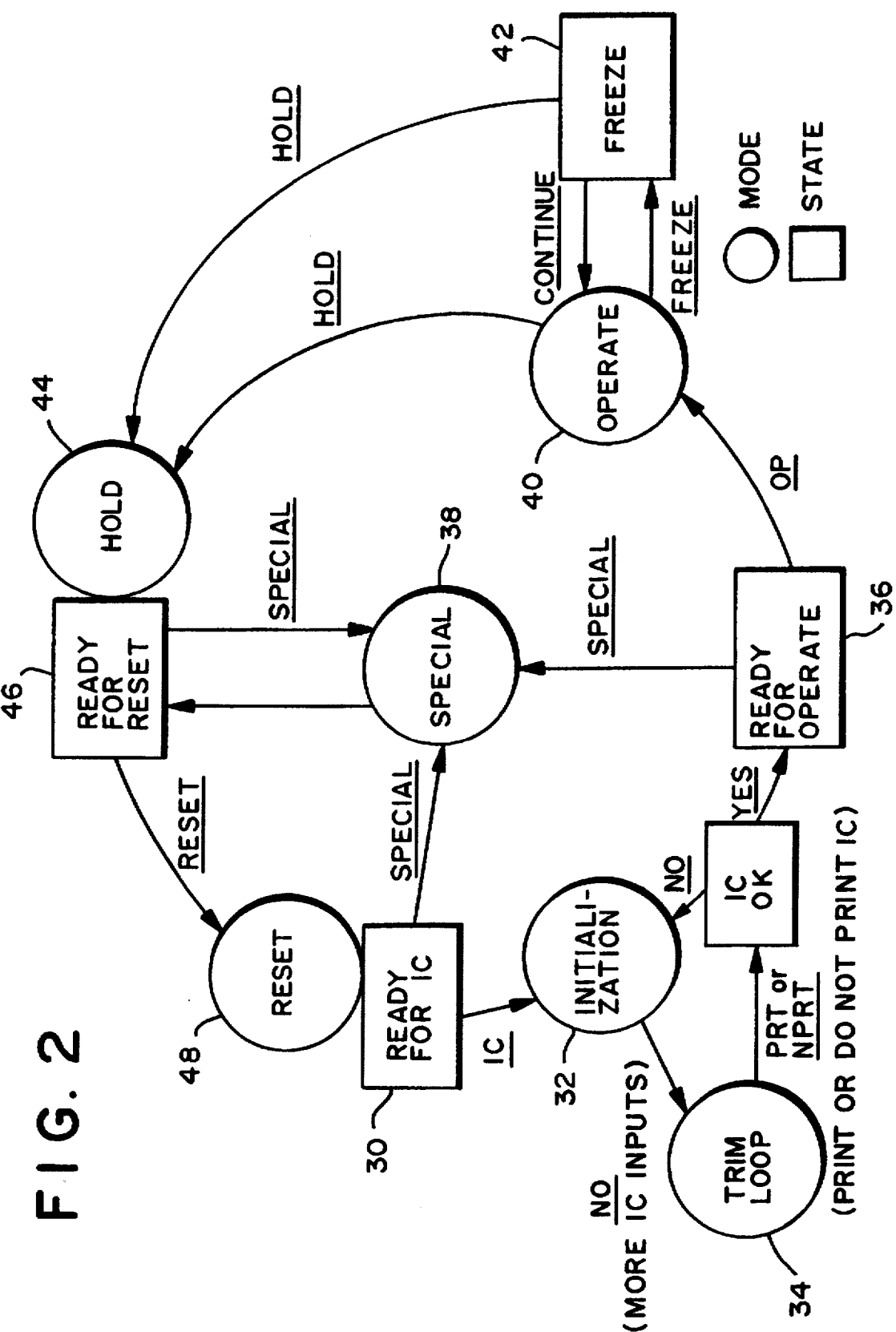
FIG. 2 is a state transition diagram showing the various states that the system passes through during a normal simulation run.

While in operate, it may be desireable to temporarily suspend execution of the simulation, then subsequently return to the operate mode. Similarly, at some point in time the operate mode will normally be terminated in some orderly fashion, possibly to return to an initialization state. This sequence of states and state transitions is detailed in FIG. 2. When the simulation tool is first placed into execution on a host processing system, it is in the 'ready for ic' state 30. A user command causes the simulation to enter the initialization mode 32.

During initialization, the simulation tool accepts input defining the state of problem variables in the various application subsystem components. When no further initialization input is required the system proceeds to the trim mode 34. In the trim mode, application subsystem components are cyclically invoked in a manner similar to the operate mode with the exception that time is held constant at its initial value. Once initialization is complete, the system enters the 'ready for operate' state 36. At this point all components of the system have been prepared for execution. An escape mechanism, the special mode 38, permits bypassing the operate mode 40 so that the system may be reinitialized if necessary.

Once the operate mode has been entered, it may be suspended: the 'freeze' state 42; or terminated: the hold mode 44, leading to the 'ready for reset' state 46. Once in 'ready for reset' the system may be returned to 'ready for ic' by entering the reset mode 48. The hold and reset modes provide points at which special processing may be done to safe or reset hardware in the loop, gather data, or prepare for a return to the initialization mode.

The simulation tool timing element and local schedulers participate in the trim and operate modes; the global scheduler is required only for the operate mode. In the trim mode, the timing element invokes the local schedulers cyclically until the processing mode is terminated by user command. In the operate mode, the timing element invokes the global scheduler cyclically until the processing mode is terminated by user command.

Timing Element

Figure 3:
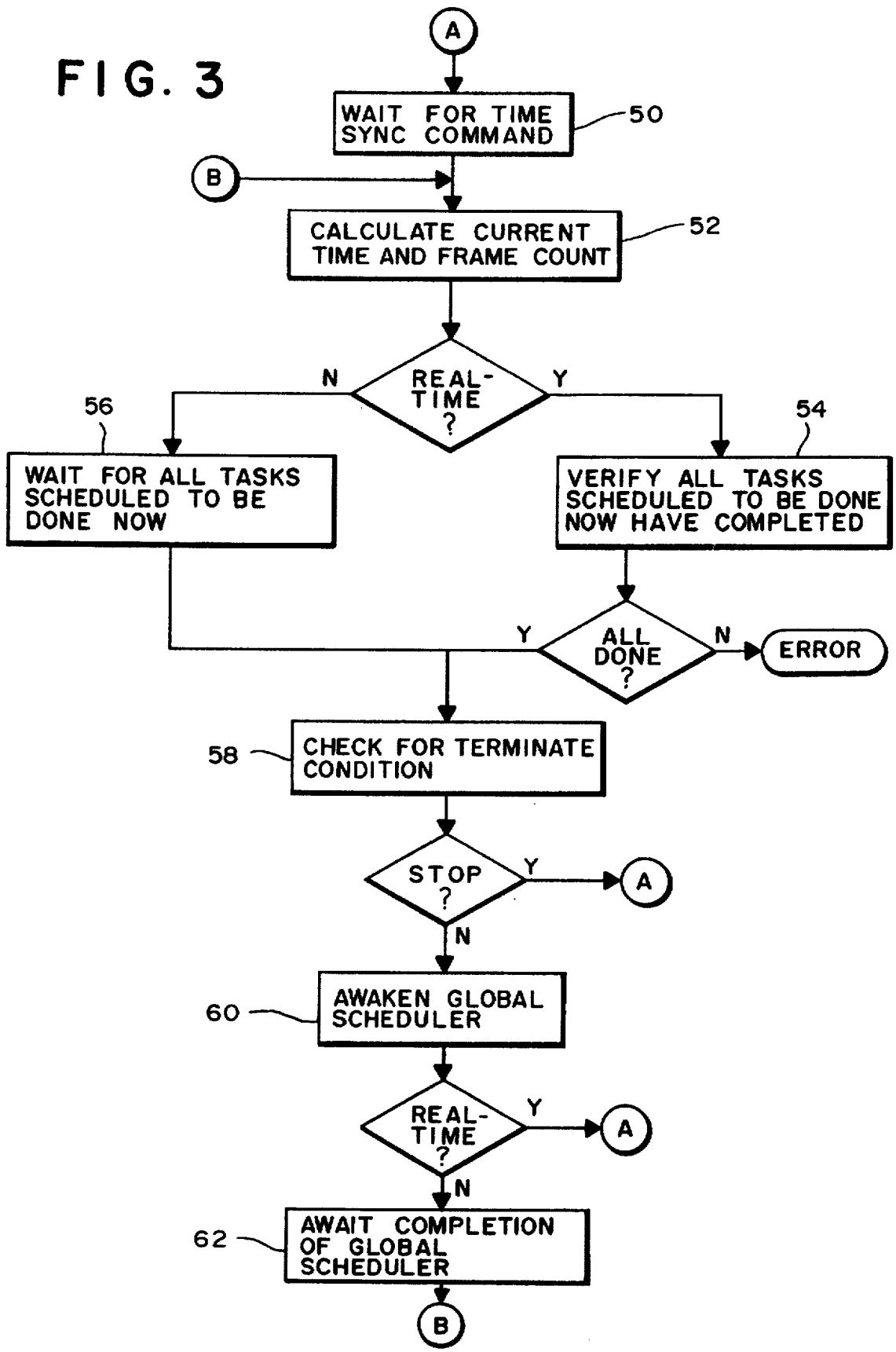
FIG. 3 is a flow diagram illustrating the execution flow of the timing element of the present system.

The operate processing flow of the timing element is depicted in FIG. 3. The timing element functions in a simulation infinite loop, at the top of the loop waiting for a global synchronization command 50 from either the clock source or the user.

Synchronization commands from the user occur only to initiate the first simulation cycle in operate. Thereafter, only clock source time synchronization commands are accepted. The clock source may be any time source, either software or hardware, capable of providing a time signal, in the form of a process wakeup command in the native operating system context. Once the timing element has been awakened by the synchronization command it computes the current simulation time and frame count 52.

As noted previously, the system functions cyclically. As part of initialization processing the user defines a simulation time interval to be associated with each cycle (frame). This time interval is the minimum time granularity permitted by the simulation executive. All times computed during the processing of discrete events or continuous models is resolved to an integral multiple of this time interval. This interval is normally a submultiple of the continuous model cycle time. Simulation time is advanced in multiples of this minimum time interval, in accordance with the time intervals utilized by the continuous models and the event times generated by discrete event processing. The current frame count is the count of the number of minimum time intervals elapsed since the operate process commenced.

Once the current time and frame count are known, the timing element tests for the current operating mode: real-time or non-real-time. If operating in real-time mode the timing element requires that all processes started in a previous cycle, that were scheduled to be complete by the current time, have in fact completed (54). If any such process is found to still be in execution, the system has failed to meet the time constraints imposed by real-time operation; an error notification is issued to the operator and the system terminates the operate process. If operating in non-real-time, the timing element simply waits until all processes scheduled to complete by the current time have completed (56).

Next, the timing element checks for a simulation termination condition; there are two defined: a freeze command, and a hold command. Both conditions are operator initiated. If either condition is detected the timing element will transition to the appropriate mode (freeze or hold) and return to the wait for synchronization command (50). If no terminate condition is outstanding the operate mode remains in effect and the timing element commands the execution of a simulation cycle by issuing a global simulation scheduler task dispatch command (60). If operating in real-time the timing element then returns to the synchronization command wait 50. Otherwise, the timing element awaits completion of global scheduler processing (62). Since in non-real-time mode synchronization with a clock source is not required, the next simulation cycle commences immediately by transferring control to the top of the loop (52).

Global Scheduler

Figure 4:
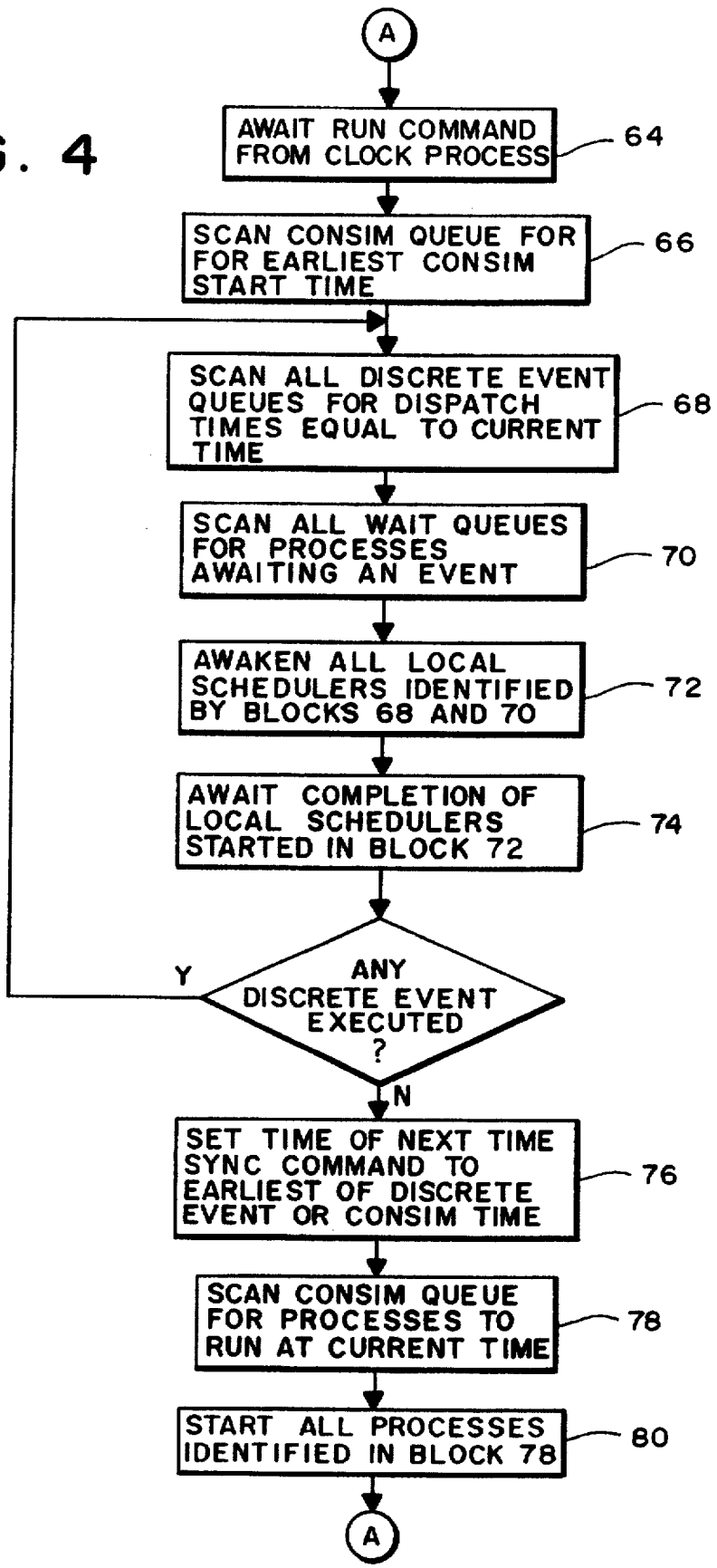
FIG. 4 is a flow diagram illustrating the execution flow of the global scheduler.

Processing flow of the global scheduler is depicted in FIG. 4. The global scheduler functions as an infinite loop comprised of: accepting commands from the timing element, performing task dispatch processing, and computing the next simulation time at which task dispatch is required. Commands arrive from the timing element in the form of global simulation scheduler task dispatch commands 64, FIG. 4. One command is issued for each simulation cycle for which application subsystem processing is to occur. Multiples of the minimum time interval may elapse between synchronization commands. Once awakened by arrival of a command, the global scheduler scans all queue entries in the continuous model dispatch queue (consim queue) 66 searching for the earliest time, following the current time, at which a continuous model process is next scheduled to run. This time is noted and saved.

The global scheduler then determines the discrete-event processes eligible to run at the current time. This is accomplished by examining the event time of the top entry of each discrete event queue in the system, as designated by 68, in FIG. 4. These queues are maintained in time sorted order, earliest time at the head of the queue. Any discrete-event process with an event time less than or equal to the current time is eligible for execution. Such processes are noted for subsequent dispatch. Similarly, each wait queue in the system is examined, 70, in FIG. 4. The entry, if any, at the top of each queue, indicates a discrete-event process eligible for execution in the current cycle; any such process is noted. This is necessary since the condition for terminating the process wait is known only to the target process, and requires that the process execute to evaluate the condition. The global scheduler then issues a local simulation scheduler task dispatch command to each of the discrete-event processes identified as eligible for execution in the current frame 72. The global scheduler then awaits completion of all discrete-event processes started 74. The sequence from 68 to 74 is repeatedly executed until no discrete-event process is found to be eligible for execution in the current frame.

Next, entries at the head of all discrete event queues in the system are examined to determine the earliest event time presently scheduled following the current time, as designated by 76, in FIG. 4. The lesser of this time, and the previously determined next continuous model task dispatch time, is then noted as the time to be associated with the next global synchronization command. If operating in real-time, the clock source is adjusted to produce a synchronization command at that time.

Once all discrete-event processes eligible to run this cycle have been executed, the global scheduler will awaken all continuous model processes scheduled to be dispatched at the current time. This is accomplished by scanning the consim queue for queue entries with a dispatch time equal to the current time, and issuing local simulation scheduler task dispatch commands to the continuous model processes so identified, 78–80. Each consim queue entry maintains the current and next dispatch times, basic cycle interval time, remaining cycle interval time, and a user specified delta time (minimum allowable delta time between dispatch cycles) for the associated process.

As each application process is dispatched, the global scheduler computes the target processes' next anticipated dispatch time to be the earliest of the previously determined next discrete event time, and the sum of the current time and the remaining cycle interval time. A minimum allowable dispatch time is computed as the sum of the current time and a user specified delta time. The greater of the next anticipated dispatch time and the minimum allowable dispatch time is selected as the target process' next dispatch time; the consim record entries are updated to reflect the new dispatch time. This is the mechanism by which continuous model simulation components are synchronized to discrete-event components. The global scheduler then returns to await the next global simulation scheduler task dispatch command.

Local Scheduler

Figure 5:
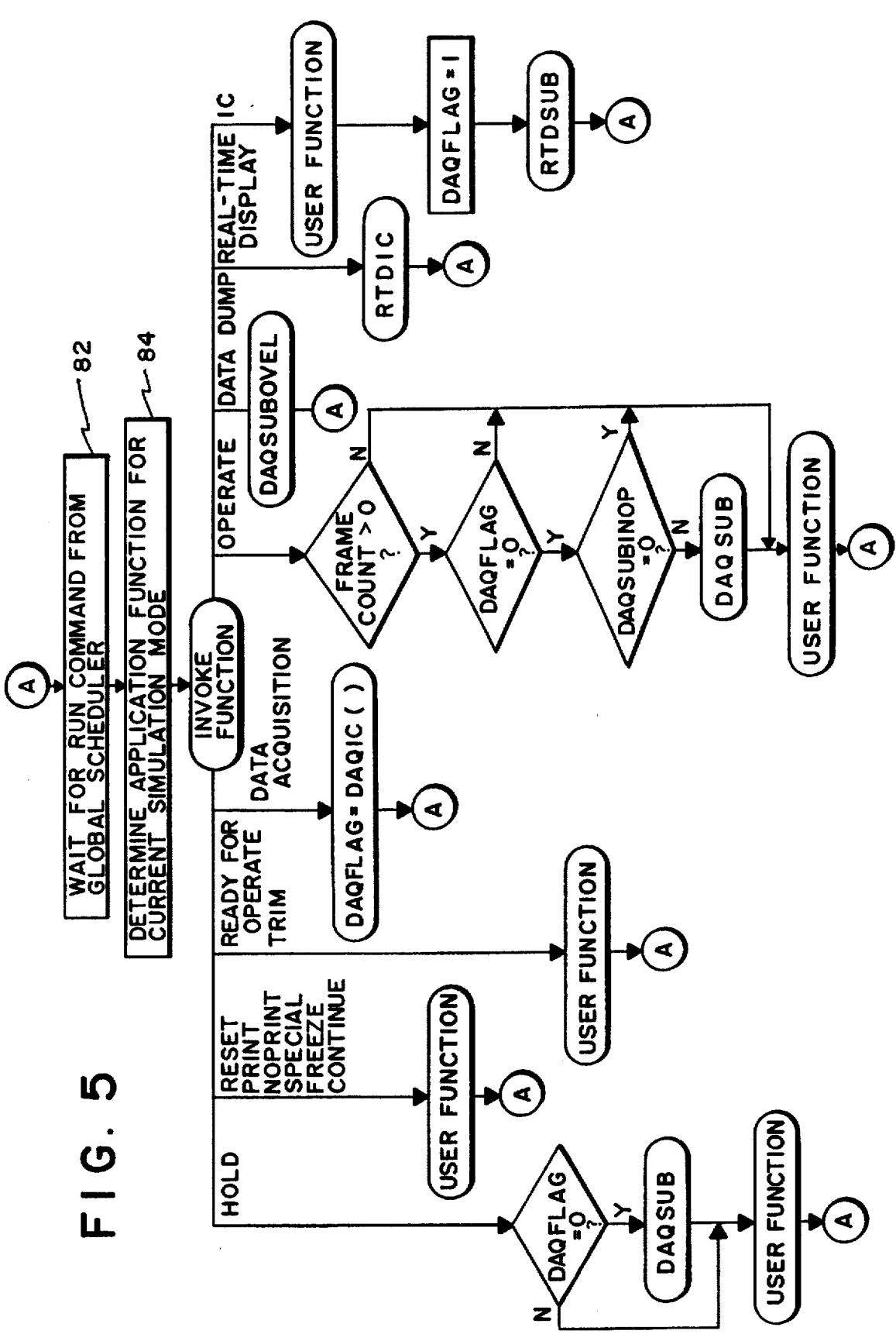
FIG. 5 is a flow diagram illustrating the execution flow of the local scheduler of the present system.

Processing flow of the local scheduler is depicted in FIG. 5. The local scheduler functions as an infinite loop: awaiting a run command from the global scheduler and executing application software components as a function of the current simulation mode. Run commands arrive from the global scheduler in the form of local simulation scheduler task dispatch commands; one command is issued for each simulation cycle in which the target process is to execute. Once awakened by a run command 82 (FIG. 5), the local scheduler will determine the current simulation mode (initialization, trim, operate, hold, etc.) and invoke a user specified function (i.e. dispatching control), 84 (FIG. 5), to perform processing associated with the given mode. In the case of the operate mode, discrete-event local schedulers invoke a function to extract the event record at the head of the process' event queue, invoke a user supplied event handler, and remove the event from the queue. Continuous model local schedulers simply invoke the normal operate processing mode function supplied by the user. Depending on the current simulation mode, the local scheduler may perform additional processing relating to data acquisition and display operations.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A method for analysis of an application specific system using combined discrete event and continuous model simulation, comprising the steps of:

a. providing a first software component, serving as a timing element, for receiving global synchronization commands as input and issuing global simulation scheduler task dispatch commands as output;

b. providing a second software component, serving as a global simulation scheduler, for receiving said global simulation scheduler task dispatch commands as input, synchronizing discrete event model and continuous model task dispatch as a function of simulation time, and issuing local simulation scheduler task dispatch commands as output; and c. providing at least a single third software component, serving as a local simulation scheduler, for receiving said local simulation scheduler task dispatch commands as input and issuing local simulation task execution commands as output;

the combination of these steps providing a processing environment wherein said local simulation task execution commands invoke user supplied simulation application tasks in a time synchronized manner;

wherein said first software component executes a simulation loop in real-time and includes the steps of:

i) waiting for a global synchronization command from a clock source or the user, said command occurring at a point in time in the real world which has been predetermined by the global simulation scheduler;

ii) terminating the simulation loop if any previously started task, scheduled to complete at or prior to the current time, has failed to complete;

iii) terminating the simulation loop if a simulation termination condition is true;

iv) issuing a global simulation scheduler task dispatch command; and v) returning to step i.

2. The method according to claim 1, wherein said second software component synchronizes discrete event model and continuous model task dispatch as a function of simulation time and includes the steps of:

a. providing a plurality of globally accessible execution queues for all discrete event software components in the system;

b. providing a plurality of globally accessible wait queues for all discrete event software components in the system;

c. providing a globally accessible execution queue for all continuous model software components in the system;

d. managing local simulation scheduler task dispatch by:

i. awaiting a global simulation scheduler task dispatch command from said first software component;

ii. scanning the continuous model execution queue entries for the next earliest continuous model task dispatch time;

iii. scanning all discrete event execution queues and issuing a local simulation scheduler task dispatch command for those local schedulers with a discrete event time matching the current time;

iv. scanning all discrete event wait queues and issuing a local simulation scheduler task dispatch command for those local schedulers with one or more queue entries;

v. awaiting task completion of each discrete event local scheduler dispatched in step (iii) or (iv);

vi. returning to step (ii) if any discrete event local scheduler updated any event or wait queue in the system;

vii. adjusting the scheduled time of the next global synchronization command to be the earliest of the next discrete event or continuous model local simulation scheduler task dispatch command time after the current time;

viii. adjusting the next local simulation scheduler task dispatch command time to coincide with the next discrete event local simulation scheduler task dispatch command time, and issuing a local simulation scheduler task dispatch command, for each continuous model local simulation scheduler on the execution queue with a dispatch time matching the current time; and ix. returning to step i.

3. The method according to claim 2, wherein said step of adjusting the next local simulation scheduler task dispatch command time includes the step of adjusting the next local simulation scheduler task dispatch command time for each continuous model process to the greater of: the current time plus a user specified delta time, and the next discrete event local simulation scheduler task dispatch command time.

4. The method according to claim 1, wherein said first software component is capable of executing a simulation loop in non-real-time including the steps of:

a. waiting for global synchronization command from the user;

b. waiting for completion of any previously started task scheduled to complete at or prior to the current time;

c. terminating the simulation loop if a simulation termination condition is true;

d. issuing a global simulation scheduler task dispatch command;

e. waiting for completion of the global simulation scheduler task; and f. returning to step b.

5. The method according to claim 1, wherein said step of providing a third software component comprises providing a single software component to manage local simulation task execution commands and includes the steps of:

a. waiting for a local simulation scheduler task dispatch command from the second software component;

b. dispatching control to an application software component associated with the current simulation operating mode; and c. returning to step a.

6. The method according to claim 1, wherein said step of providing a third software component comprises providing a plurality of software components, each managing local simulation task execution commands and including the steps of:

a. waiting for a local simulation scheduler task dispatch command from the second software component;

b. dispatching control to an application software component associated with the current simulation operating mode; and c. returning to step a.

7. A simulation and analysis tool for an application specific system using combined discrete event and continuous model simulation, comprising:

a. a first software component, serving as a timing element, for receiving global synchronization commands as input and issuing global simulation scheduler task dispatch commands as output;

b. a second software component, serving as a global simulation scheduler, for receiving said global simulation scheduler, for receiving said global simulation scheduler task dispatch commands as input, synchronizing discrete event model and continuous model task dispatch as a function of simulation time, and issuing local simulation scheduler task dispatch commands as output; and c. at least a single third software component, serving as a local simulation scheduler, for receiving said local simulation scheduler task dispatch commands as input and issuing local simulation task execution commands as output;

the combination of which provides a processing environment wherein said local simulation task execution commands invoke user supplied simulation application tasks in a time synchronized manner, wherein said first software component executes a simulation loop in real-time and includes means for:

a) waiting for a global synchronization command from a clock source or the user, said command occurring at a point in time in the real world which has been predetermined by the global simulation scheduler;

b) terminating the simulation loop if any previously started task, scheduled to complete at or prior to the current time, has failed to complete;

c) terminating the simulation loop if a simulation termination condition is true;

d) issuing a global simulation scheduler task dispatch command; and e) returning to step a.

d. issuing a global simulation scheduler task dispatch command; and e. returning to step a.

8. The simulation and analysis tool according to claim 7, wherein said second software component synchronizes discrete event model and continuous model task dispatch as a function of simulation time and comprises:

a. a plurality of globally accessible execution queues for all discrete event software components in the system;

b. a plurality of globally accessible wait queues for all discrete event software components in the system;

c. a globally accessible execution queue for all continuous model software components in the system; and, d. means for managing local simulation scheduler task dispatch by:

i. awaiting a global simulation scheduler task dispatch command from said first software component;

ii. scanning the continuous model execution queue entries for the next earliest continuous model task dispatch time;

iii. scanning all discrete event execution queues and issuing a local simulation scheduler task dispatch command for those local schedulers with a discrete event time matching the current time;

iv. scanning all discrete event wait queues and issuing a local simulation scheduler task dispatch command for those local schedulers with one or more queue entries;

v. awaiting task completion of each discrete event local scheduler dispatched in step (iii) or (iv);

vi. returning to step (iii) if any discrete event local scheduler updated any event or wait queue in the system;

vii. adjusting the scheduled time of the next global synchronization command to be the earliest of the next discrete event or continuous model local simulation scheduler task dispatch command time after the current time;

viii. adjusting the next local simulation scheduler task dispatch command time to coincide with the next discrete event local simulation scheduler task dispatch command time, and issuing a local simulation scheduler task dispatch command, for each continuous model local simulation scheduler on the execution queue with a dispatch time matching the current time; and ix. returning to step i.

9. The simulation and analysis tool according to claim 8, wherein said means of adjusting the next local simulation scheduler task dispatch command time includes means for adjusting the next local simulation scheduler task dispatch command time for each continuous model process to the greater of: the current time plus a user specified delta time, and the next discrete event local simulation scheduler task dispatch command time.

10. The simulation and analysis tool according to claim 7, wherein said first software component executes a simulation loop in non-real-time and includes means for:

a. waiting for a global synchronization command from the user;

b. waiting for completion of any previously started task scheduled to complete at or prior to the current time;

c. terminating the simulation loop if a simulation termination condition is true;

d. issuing a global simulation scheduler task dispatch command;

e. waiting for completion of the global simulation scheduler task; and f. returning to step b.

11. The simulation and analysis tool according to claim 7, wherein said third software component comprises a single software component to manage local simulation task execution commands and includes means for:

a. waiting for a local simulation scheduler task dispatch command from the second software component;

b. dispatching control to an application software component associated with the current simulation operating mode; and c. returning to step a.

12. The simulation and analysis tool according to claim 7, wherein said third software component comprises a plurality of software components, each managing local simulation task execution commands and including means for:

a. waiting for a local simulation scheduler task dispatch command from the second software component;

b. dispatching control to an application software component associated with the current simulation operating mode; and c. returning to step a.

13. The simulation and analysis tool according to claim 7, wherein said first software component, said second software component, and said third software component execute on a single processor node.

14. The simulation and analysis tool according to claim 7, wherein said first software component, said second software component, and said third software component execute on a plurality of processor nodes.

* * * * *